(12) United States Patent
Hung

(10) Patent No.: US 6,294,918 B1
(45) Date of Patent: Sep. 25, 2001

(54) METHOD FOR LOCATING WEAK CIRCUIT HAVING INSUFFICIENT DRIVING CURRENT IN IC CHIPS

(75) Inventor: Hui-Chuan Hung, Chu-Pei (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/404,576

(22) Filed: Sep. 23, 1999

(51) Int. Cl.[7] .................................................. G01R 31/00
(52) U.S. Cl. ............................................. 324/751; 324/765
(58) Field of Search .................................... 324/750, 751, 324/752, 71.3, 501, 765, 500; 250/492.2, 310, 311

(56) References Cited

U.S. PATENT DOCUMENTS 4,417,203 * 11/1983 Pfeiffer et al. ........................ 324/71.3
5,523,694 * 6/1996 Cole, Jr. ................................. 324/751
5,528,156 * 6/1996 Ueda et al. ............................ 324/751

* cited by examiner

Primary Examiner—Vinh P. Nguyen
(74) Attorney, Agent, or Firm—Tung & Associates

(57) ABSTRACT

A method for locating a weak circuit that has insufficient driving current in an IC chip is described. In the method, an active surface of an IC chip can be irradiated by an electron beam point-to-point to determine a suitable loading current that will cause functionality failure in the IC circuit scanned. The functionality failure can be detected by a functionality tester that is mounted juxtaposed to the electron beam and functions simultaneously with the scanning motion. A threshold current is then determined as the loading current that causes failure and is used to scan the complete surface of the IC chip for locating all the weak circuits that may have insufficient driving currents in the chip. A suitable loading current may be selected between about 0.1 $\mu$A and about 100 $\mu$A for testing of most IC devices.

20 Claims, 4 Drawing Sheets

Overlay of functionality image and surface image ( 2000X )

conductor    functional failure conductor

METHOD FOR LOCATING WEAK CIRCUIT HAVING INSUFFICIENT DRIVING CURRENT IN IC CHIPS

FIELD OF THE INVENTION

The present invention generally relates to a method for locating a problem circuit in an IC chip that may have insufficient driving current to function properly and more particularly, relates to a method for locating a weak circuit in an IC chip that may have insufficient driving current to function properly by scanning the chip with an electron beam and thus applying a loading current on the weak circuit to cause a functional failure of the circuit and detecting such failure by a tester mounted juxtaposed to the electron beam.

BACKGROUND OF THE INVENTION

In the fabrication of semiconductor devices, defects in the circuits formed are frequently caused by leakage current problems. The determination of a tolerance range for the leakage current in an IC circuit is therefore an important aspect in the design and fabrication of IC devices. During the design of an IC circuit in a semiconductor chip, a design margin or a process window is normally incorporated in the circuit design such that a circuit thus formed operates properly within the design margin and the process window. A weak circuit, or a weak link in the IC circuit such as that frequently observed at a node results when such design margin or process window is not properly provided during the circuit design process.

The ability of identifying and locating potentially weak circuits in a VLSI product, for instance, in a logic IC chip or in a memory chip prior to a failure of the product is therefore an important step in the quality control and reliability testing of such products. For instance, in a test procedure designed for testing the leakage current in a circuit, the IC circuit may pass under certain conditions, but may functionally fail or marginally fail under other conditions. When the driving voltage is increased in the circuit, the circuit then passes its functionality test. When this occurs, it is an indication that the internal driving capability in the IC circuit is insufficient and therefore, when the voltage becomes lower, the circuit can not pass its functionality test. In designing such a reliability test, it is always a problem that the exact locations of the weak circuits in the IC chip cannot be easily located or identified. In other words, it is very difficult to pin point the circuits within which the driving current is not high enough. While scanning electron microscopy is a well established technique in studying surfaces of an object, an optical image obtained by the technique does not reveal any information on the circuit contained inside the IC chip. Traditionally, the detection work can only be carried out by the cooperative effort between a product engineer and a circuit designer using functionality testing apparatus, computer simulation and design layout to find the potential failure sites. Such debugging work on a wafer is extremely time consuming, i.e., takes as long as two months for the task on a 6-inch wafer.

It is therefore an object of the present invention to provide a method for locating weak circuits in an IC chip that does not have the drawbacks and shortcomings of the conventional reliability testing methods.

It is another object of the present invention to provide a method for locating a weak circuit that has insufficient driving current in an IC chip which can be readily carried out in an scanning electron microscope.

It is a further object of the present invention to provide a method for locating a weak current that has insufficient driving current in an IC chip by irradiating the circuit with an electron beam that carries a loading current of not less than 0.01 µA.

It is another further object of the present invention to provide a method for locating a weak circuit that has insufficient driving current in an IC chip by scanning the chip surface point-to-point with an electron beam that carries a loading current between about 0.01 µA and about 100 µA.

It is still another object of the present invention to provide a method for locating a weak circuit that has insufficient driving current in an IC chip by first selecting a threshold current as the loading current for an electron beam which causes failure in a circuit upon irradiation by the electron beam.

It is yet another object of the present invention to provide a method for identifying a weak node that has insufficient driving current in an IC chip by scanning an electron beam on the chip and pulling down a driving current at the node to cause a functional failure of the circuit.

It is yet another further object of the present invention to provide a method for identifying a weak node that has insufficient driving current in an IC chip by first determining a threshold current of the electron beam that is used to scan the IC chip which causes failure of the circuit and then scanning the entire IC chip surface by the threshold current to locate other potentially weak circuits.

It is still another further object of the present invention to provide a method for identifying a weak node that has insufficient driving current in an IC chip by first causing functional failure in a circuit by irradiating the circuit with an electron beam that has a threshold current and then marking the failed circuit by an imaging means in the scanning electron microscope.

It is yet another further object of the present invention to provide a method for locating a weak circuit that has insufficient driving current in an IC chip by first scanning the surface of the IC chip at about 50× magnification in a scanning electron microscope for locating a failure site and then, scanning the failure site at a 2,000× magnification for showing the circuit failed.

SUMMARY OF THE INVENTION

The present invention discloses a method for locating and marking a weak circuit that has insufficient driving current in an IC chip.

In a preferred embodiment, a method for locating a weak circuit that has insufficient driving current in an IC chip can be carried out by the operating steps of first positioning an IC chip in a vacuum chamber equipped with an electron source, irradiating an active surface of the IC chip point-to-point with an electron beam from the electron source that has a loading current between about 0.01 µA and about 100 µA, setting a threshold current as the loading current at which a circuit on the IC chip fails upon irradiating by the electron beam, highlighting the failed circuit by an imaging method to facilitate identification, and scanning the remaining un-irradiated surface of the IC chip with the threshold current of the electron beam.

The method for locating a weak circuit that has insufficient driving current in an IC chip may further include the step of controlling a diameter of the electron beam by selecting an aperture size. The method may further include the step of setting an electron beam at a diameter of between about 1 µm and about 10 µm. The method may further include the step of irradiating the active surface of the IC chip point-to-point with an electron beam at about 50× magnification, or a second step of irradiating a failure site identified in the chip with an electron beam at about 2,000× magnification.

The method may further include the step of irradiating the IC chip with an electron beam that has a loading current of about 50 µA, or the step of irradiating with an electron beam that has a loading current of about 0.01 µA for producing a high resolution image. The electron beam may function as a loading current and further reduces a driving current of a circuit for causing a failure of the circuit. The method may further include the step of irradiating the active surface of the IC chip point-to-point for 1 msec at each point. The method may further include a two-step detection process consisting of a first step for determining a threshold current, and a second step of locating the other failure sites by scanning with the threshold current.

In another preferred embodiment, a method for identifying a weak node that has insufficient driving current in an IC chip is provided which can be carried out by the steps of mounting an IC chip on a platform in a scanning electron microscope, scanning an electron beam on an active surface of the IC chip, the electron beam has a loading current of at least 0.01 µA, pulling down a driving current of a circuit being scanned by the loading current of the electron beam to cause a functional failure of the circuit, testing the failed circuit with a tester mounted juxtaposed to the electron beam to confirm the driving current of the failed circuit is reduced by the loading current of the electron beam, marking the failed circuit by an imaging means in the microscope, and identifying other failed circuits by continuing scanning the active surface of the IC chip with the electron beam that carries the loading current.

The method for identifying a weak node that has insufficient driving current in an IC chip may further include the step of carrying out an IC test pattern on the active surface of the IC chip. The method may further include the step of withdrawing a vacuum in the scanning electron microscope prior to scanning the electron beam on the chip. The method may further include the step of controlling an aperture of the scanning electron microscope such that a diameter of not more than 10 µm of the electron beam is maintained. The method may further include the step of scanning the electron beam on the active surface of the IC chip at a magnification of about 50×, or the step of scanning an identified failure site on the IC chip at a magnification of up to 7,000×, or the step of scanning an identified failure site on the IC chip at a magnification of about 2,000×. The method may further include the step of scanning the electron beam on the active surface of the IC chip with a loading current between about 0.01 µA and about 100 µA. The step of scanning the electron beam on the active surface of the IC chip may be conducted point-by-point with a scanning time of about 1 msec at each point.

In still another preferred embodiment, a method for locating a weak circuit that has insufficient driving current in an IC chip may be carried out by the steps of mounting an IC chip in a cavity of a scanning electron microscope, withdrawing a vacuum in the cavity of the microscope, scanning a plurality of circuits by an electron beam on the active surface of the IC chip, the electron beam may have a loading current between about 0.1 µA and about 100 µA, pulling down a driving current of a circuit being scanned by the loading current of the electron beam to cause a functional failure of the circuit, testing the failed circuit with a tester mounted juxtaposed to the electron beam to confirm a reduction of the driving current of the failed circuit by the loading current, highlighting the failed circuit by an imaging means in the microscope, and locating other failed circuits by continuing scanning the active surface of the IC chip with the electron beam that carries the loading current.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for locating a week circuit that has insufficient driving current in an IC chip as a reliability test method. The method utilizes the principle that an electron beam which carries a loading current when irradiated on a circuit in the IC chip acts as a load to the circuit and pulls down a driving current of the circuit and cause a functional failure, when such circuit is a weak node in the IC chip. The testing of the circuit and the scanning of the electron beam are conducted concurrently by utilizing a tester that is mounted juxtaposed to the electron beam such that, for instance, at each 1 msec time interval, a spot on the IC chip can be scanned. The tester utilized is a functionality tester that is readily available commercially.

It has been found that a suitable loading current of the electron beam utilized in the present invention novel method may be between about 0.01 µA and about 100 µA. For the purpose of this writeup, the word "about" is used to mean a range of ±10% from the value indicated, by about 100 µm, it is meant a range of current between 90 µm and 110 µm. A threshold current is designated as the loading current at which a circuit on the IC chip fails upon irradiating by the electron beam. After a weak circuit is identified by the loading current of the electron beam, an imaging means is utilized to highlight the failed circuit for easy identification. The remaining surface of the IC chip is then completely scanned by the threshold current to identify any other weak circuits in the chip.

It was also found that the electron beam can be suitably set to a diameter between about 1 µm and about 10 µm, which is controlled by selecting a suitable aperture size of the scanning electron microscope.

The present invention novel method can thus be carried out in two-step process in which a first step scanning by an electron beam is conducted at about 50× magnification, followed by a second step scanning by the electron beam at about 2,000× magnification. For the purpose of this write-up, the word "about" means a value within the range of ±10% of the value given. For instance, at about 50× magnification, it is meant that a magnification between 45× and 55×.

A suitable loading current for the electron beam used in the present invention novel method may be about 50 μA, or can be as low as 0.01 μA for producing high resolution images. In a scanning method, the step of irradiating the active surface of the IC chip can be carried out point-to-point for 1 m sec interval at each point. The present invention novel method may further be carried out by a first step of determining a threshold current, and a second step of locating all the other failure sites by scanning the chip with the threshold current.

Figure 1:
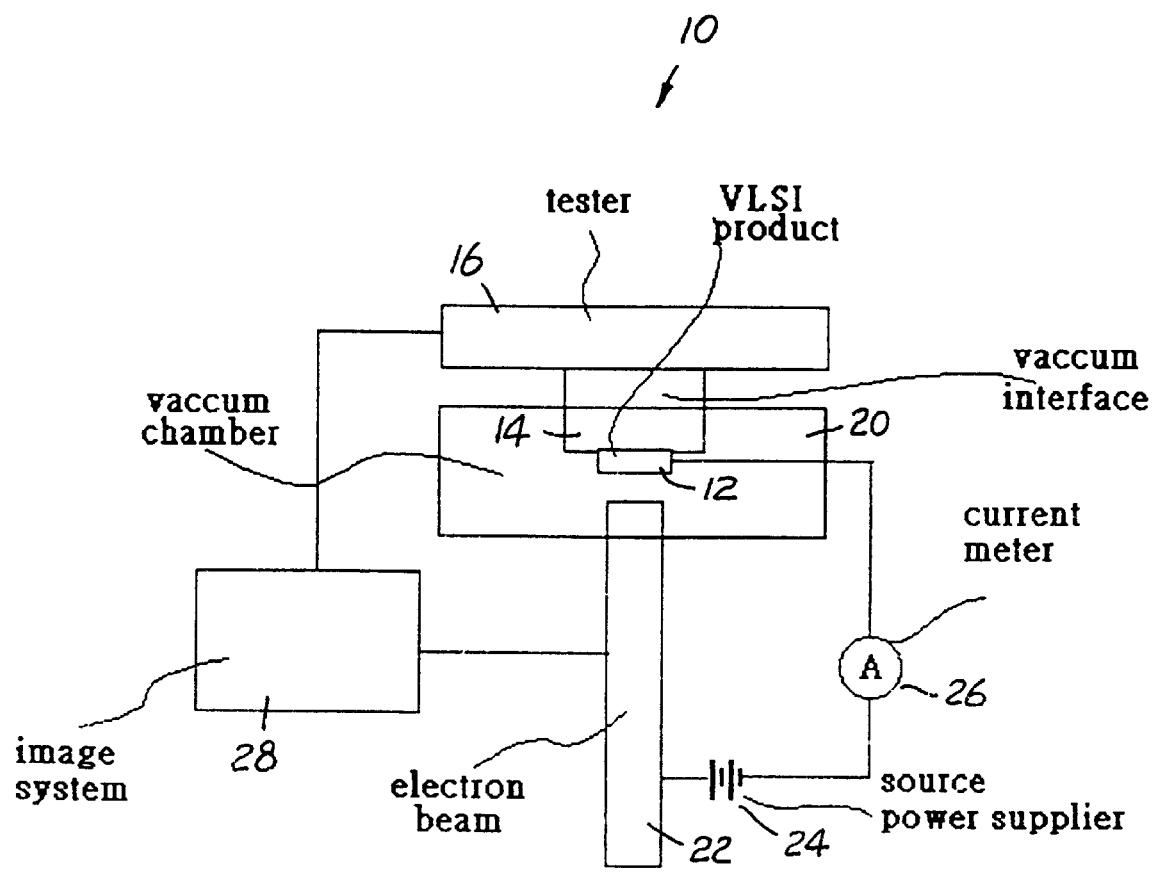
FIG. 1 is an illustration of the vacuum chamber utilized in the present invention method for mounting a VLSI chip tested.

Referring initially to FIG. 1, wherein an illustration of the present invention apparatus 10 for mounting a VLSI chip 12 is shown. The chip 12 is mounted on a sample mounting platform 14 and a functionality tester 16. The chip 12 and the platform 14 are mounted in a vacuum chamber 20 which may be a cavity in a scanning electron microscope that is equipped with an electron beam 22. It should be noted that, the illustration of FIG. 1 is reverse that normally shown for a scanning electron microscope arrangement in which the electron beam source 22 is normally positioned on top.

The apparatus 10, which may be a scanning electron microscope, further includes an electron source power supplier 24, a current meter 26 and an imaging system 28. The imaging system 28 can be programmed to highlight specific areas in an image formed on a display screen such that the specific feature, i.e., a failed circuit in the present case, can be easily identified. The electron source power supply 24 is capable of producing electron beams that have intensities in the range between about 0.01 μA and about 100 μA. Normally, the electron beam intensity is more than 1 μA, however, for high resolution images, a beam current as low as 0.01 μA can be used to produce a very small beam spot and thus a sharper image.

Figure 2:
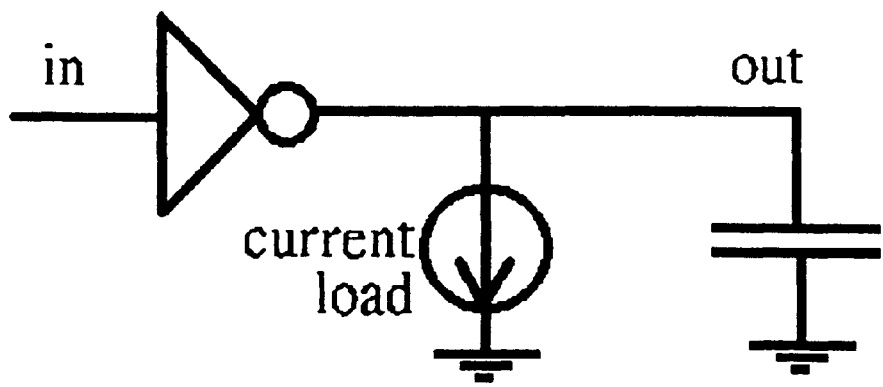
FIG. 2 is an illustration of the loading current of an electron beam and the resulting driving current in a circuit either with or without the loading current.
Figure 2:
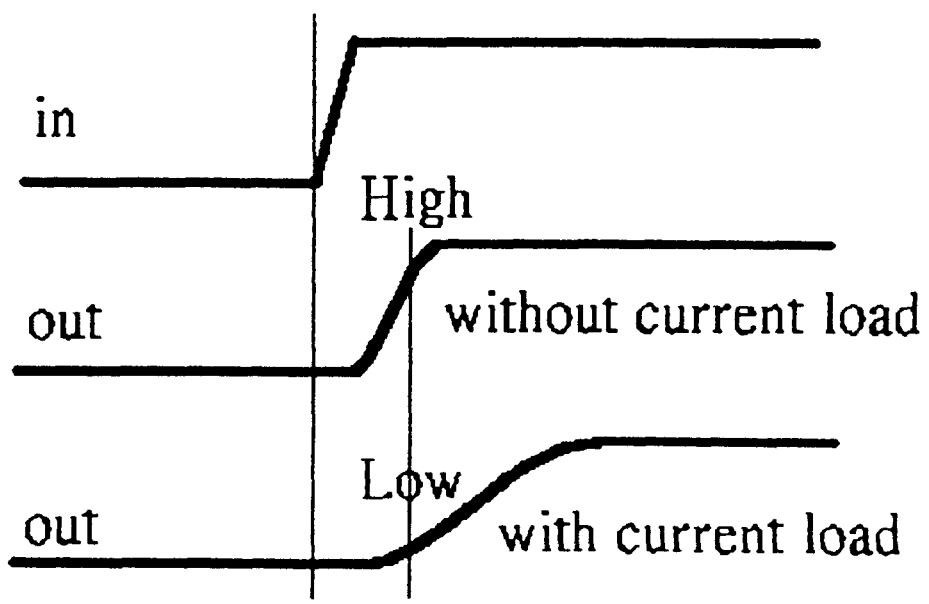

The electron beam that bombards the circuit in an IC chip is itself a negative current, i.e., carries a loading current or functions as a negative component for the driving current in the IC circuit. The present invention novel method therefore utilizes an electron beam tip to find in an IC circuit a weak node where there is insufficient driving current. This is shown in FIG. 2. For instance, when an IC circuit fails at 3.5 V, but passes at 3.6 V, the present invention novel method starts testing at 3.6 V by mounting a tester juxtaposed to the electron beam apparatus. The functionality tester is used to test the circuit at 3.6 V. When the electron beam is used to scan over the active surface of the chip, the mechanical scanning speed is much slower than the electronic testing speed achievable by the functionality tester. For instance, when a testing procedure is carried out for an IC test pattern for 1 msec at each stop, the electron beam is scanned from point-to-point (or from pixel-to-pixel) at 1 msec interval between pixels. The IC chip is scanned and tested one point at a time. When the electron beam is scanned to a weak node, i.e., at a metal conductor, where driving current is insufficient, the electron beam becomes a current loading and pulls down the driving current of the circuit. This is shown in FIG. 2 by the bottom trace. As a result, even though at a loading current of 3.6 V of the electron beam which the IC circuit should pass, the electron beam becomes a loading at the weak node and thus makes the driving current at the node even smaller and causing the failure of the node, and as a consequence, the failure of the IC circuit.

The present invention novel method can therefore be utilized in testing an IC circuit that, for instance, originally outputs 1 mA, however, under a loading current of 100 μA carried by the electron beam, the output of the IC circuit drops to 900 μA (or to 950 μA) which renders a functionality failure for the IC circuit. When such a failed circuit is identified and located, i.e., at a node, a metal line or a conductor, the specific location of the circuit can be highlighted to indicate the failure site by preprogramming an imaging system for the microscope which performs the highlighting function automatically. Furthermore, when a failure site is detected, the functionality tester sends out a pulse (the functionality tester normally sends out a pass or fail signal at the end of each test), the imaging system highlights into a bright spot on a display screen. The bright spot is easily identified when compared to a dark background where no circuit failure is detected. The image can then be printed out and overlapped with a regular SEM image of the IC chip to pin point the location of the failure in reference to the circuit. This is shown in FIGS. 3 and 4.

Figure 3:
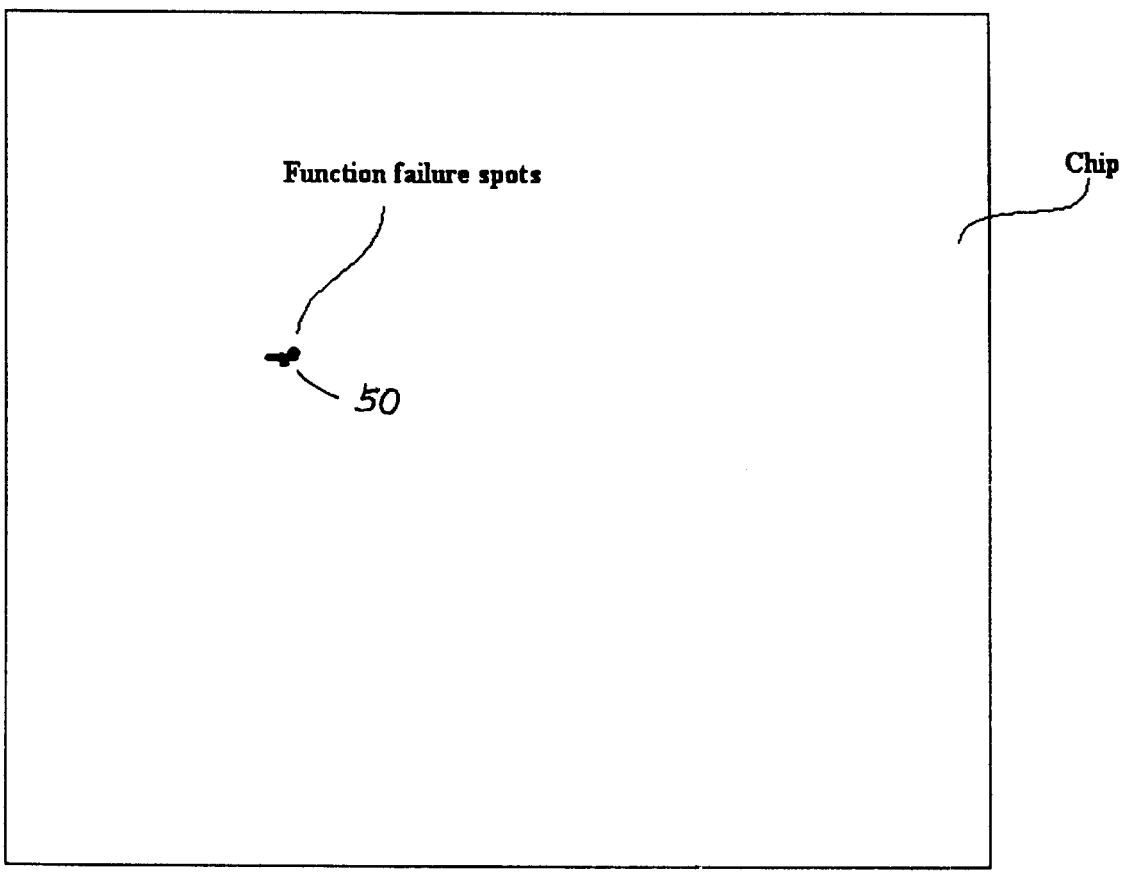
FIG. 3 is an illustration showing an IC chip that has a functional failure spot in a circuit obtained at 50× magnification.
Figure 4:
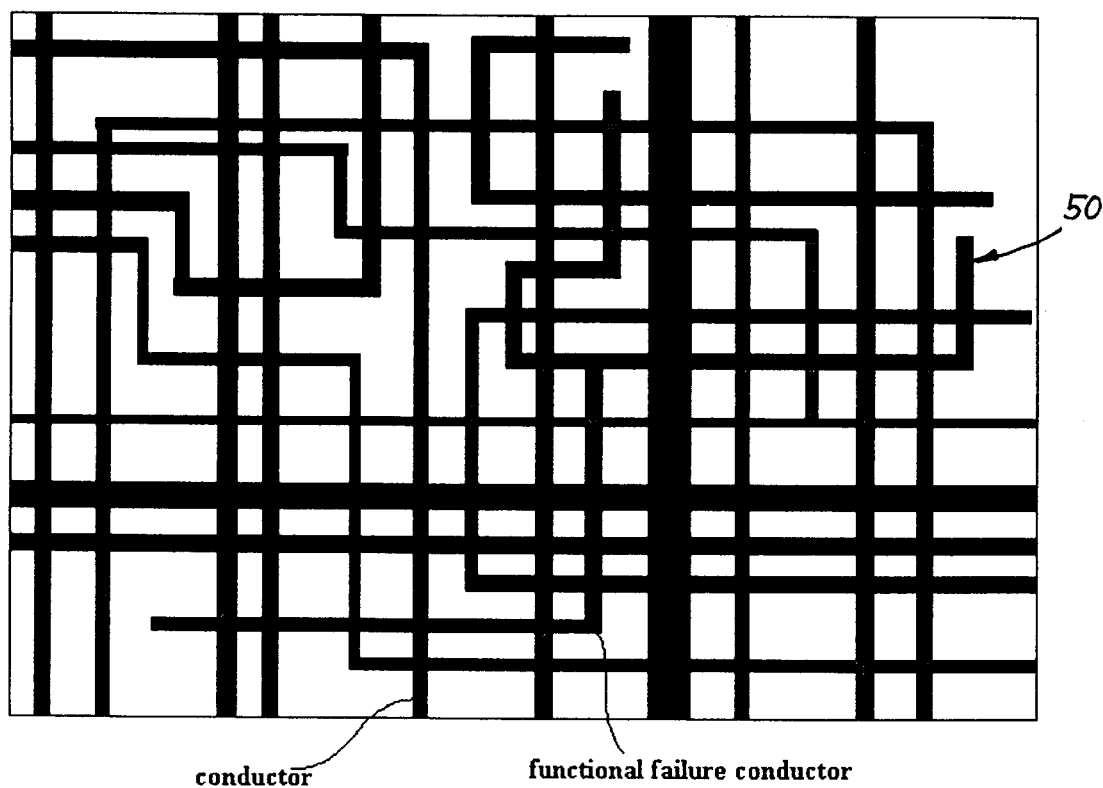
FIG. 4 illustrates an overlay of a functionality image and a surface image obtained at 2,000× magnification showing the functional failed conductor.

FIG. 3 shows a functionality image of a chip at 50× magnification indicating a function failure spot 50. The function failure spot 50 can then be further magnified in another image obtained at 2,000× magnification, shown in FIG. 4, in an overlay of the functionality image and a regular surface image of the chip. The functional failed conductor 50 is shown in black lines, while the other conductors that function properly are shown in shaded lines. The image shown in FIG. 4 is a zoom-in image that can be produced at up to 7,000× magnification. The black lines, or the functional failure conductors 50 is where the driving current at the failure node is too weak (or low). For instance, when the driving current of the driver for two devices, for instance, two logical gates is already low, electron beam scanned at such spot further pulls down the driving current, the driving current is no longer capable of driving the two gates which leads to a complete failure of the IC circuit.

In practicing the present invention novel method, the electron beam may be scanned from an upper left corner of the IC chip toward the right upper corner, and then starting the next line from left to right. The size of the electron beam can be determined by the aperture size of the SEM apparatus, i.e., it may be between about 1 μm and about 100 μm, depending on the aperture size. When the electron beam scans to a problem circuit, the functionality tester tests and finds functional failure at the site. The zoom-in feature can then be used for obtaining a higher magnification of the failed spot, i.e., up to 7,000×. The present invention novel method can be normally started at 50× magnification to find a failure spot, the zoom-in feature at 2,000× magnification can then be used to repeat the process in obtaining a higher magnification of the image of the failed circuit.

The loading current of the electron beam can be suitably set at 50 μA for most tests conducted on IC chips. Depending on the aperture size utilized, loading current as high as 100 μA or as low as 0.01 μA may be used. When high resolution image is desired, a small beam current which produces a small beam spot should be used, i.e., a beam current of 10 nano-amp or 0.01 μA.

The present invention novel method is therefore based on an unique use of an electron beam. Instead of generating a current such as that in a normal EBIC (electron beam induced current) technique, the present invention novel method utilizes an electron beam as a loading current, or as a negative current to pull down the driving current in a circuit detected. The present invention novel method therefore can be advantageously used not only to detect a weak point (such as a weak node) in a circuit design, i.e., a circuit that has insufficient driving capability, but also to advantageously find circuits that has timing mismatches even when the driving capability is sufficient.

When utilizing the present invention novel method, two major functions are achieved. First, the method is utilized to detect how much loading current can be tolerated by the circuits, i.e., by finding the tolerance current or the loading current which causes failure in the IC circuit. The loading current can further be called the threshold current. After the threshold current of the electron beam is determined, i.e., at 10 μA or 20 μA, etc., the present invention novel method is used to scan the entire IC chip to find all the failure sites where there are insufficient driving currents.

In a typical example, the present invention novel method can be used to perform failure analysis on an IC chip that has shown functionality failure in a KGD (known-good-die) test. For instance, when an IC chip is designed to work at a voltage range between 2.3 V~2.5 V, but the test indicates that only 50% of the circuits can function in such range, and 40% will only function at voltages larger than 2.6 V, indicating that there is a mismatch between the circuit design and the IC chip fabricated. In other words, the circuit design is inadequate or flawed. This is normally caused by factors such as too small a design margin, or too small a process window for the conducting metal layers or for the dielectric insulating layers. The present invention novel method can be advantageously used to pin point a mismatch between design and process for IC circuits.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows:

What is claimed is:

1. A method for locating a weak circuit having an insufficient driving current in an IC chip comprising the steps of:
    positioning an IC chip in a vacuum chamber equipped with an electron source,
    irradiating an active surface of the IC chip point-to-point with an electron beam from said electron source having a loading current between about 0.01 μA and about 100 μA,
    setting a threshold current as the loading current at which a circuit on said IC chip fails upon irradiating by said electron beam,
    highlighting said failed circuit by an imaging means to facilitate identification, and
    scanning a remaining un-irradiated surface of said IC chip with said threshold current of said electron beam.

2. A method for locating a weak circuit having an insufficient driving current in an IC chip according to claim 1 further comprising the step of controlling a diameter of said electron beam by selecting an aperture size.

3. A method for locating a weak circuit having an insufficient driving current in an IC chip according to claim 1 further comprising the step of setting said electron beam at a diameter between about 1 μm and about 10 μm.

4. A method for locating a weak circuit having an insufficient driving current in an IC chip according to claim 1 further comprising the step of irradiating said active surface of said IC chip point-to-point with an electron beam at about 50× magnification.

5. A method for locating a weak circuit having an insufficient driving current in an IC chip according to claim 4 further comprising a second step of irradiating a failure site identified on said IC chip with an electron beam at about 2000× magnification.

6. A method for locating a weak circuit having an insufficient driving current in an IC chip according to claim 1 further comprising the step of irradiating with an electron beam having a loading current of about 50 μA.

7. A method for locating a weak circuit having an insufficient driving current in an IC chip according to claim 1 further comprising the step of irradiating with an electron beam having a loading current of about 0.01 μA for producing high resolution images.

8. A method for locating a weak circuit having an insufficient driving current in an IC chip according to claim 1, wherein said electron beam functions as a loading current further reduces a driving current of a circuit to cause a failure of said circuit.

9. A method for locating a weak circuit having an insufficient driving current in an IC chip according to claim 1 further comprising the step of irradiating said active surface of said IC chip point-to-point for 1 msec at each point.

10. A method for locating a weak circuit having an insufficient driving current in an IC chip according to claim 1 further comprising a two-step detection process consisting of a first step for determining a threshold current, and a second step of locating all failure sites by scanning with said threshold current.

11. A method for identifying a weak node that has insufficient driving current in an IC chip comprising the steps of:
    mounting an IC chip on a platform in a scanning electron microscope
    scanning an electron beam on an active surface of said IC chip, said electron beam having a loading current of at least 0.1 μA,
    pulling down a driving current onto a circuit being scanned by said loading current of said electron beam of said scanning electron microscope to cause a functional failure of said circuit,
    testing said failed circuit with a tester mounted juxtaposed to said electron beam to confirm said driving current of said failed circuit being reduced by said loading current of the electron beam,
    marking said failed circuit by an imaging means in said microscope, and
    identifying other failed circuits by continuously scanning said active surface of the IC chip with said electron beam carrying said loading current.

12. A method for identifying a weak node that has insufficient driving current in an IC chip according to claim 11 further comprising the step of carrying out an IC test on said active surface of the IC chip.

13. A method for identifying a weak node that has insufficient driving current in an IC chip according to claim 11 further comprising the step of withdrawing a vacuum in said scanning electron microscope prior to scanning said electron beam on said chip.

14. A method for identifying a weak node that has insufficient driving current in an IC chip according to claim 11 further comprising the step of controlling an aperture of said scanning electron microscope such that a diameter of not more than 10 μm of said electron beam is maintained.

15. A method for identifying a weak node that has insufficient driving current in an IC chip according to claim 11 further comprising the step of scanning said electron beam on said active surface of the IC chip at a magnification of about 50×.

16. A method for identifying a weak node that has insufficient driving current in an IC chip according to claim 11 further comprising the step of scanning an identified failure site on said IC chip at a magnification of up to 7000×.

17. A method for identifying a weak node that has insufficient driving current in an IC chip according to claim 16, wherein said step of scanning an identified failure site on said IC chip being carried out at a magnification of about 2000×.

18. A method for identifying a weak node that has insufficient driving current in an IC chip according to claim 11 further comprising the step of scanning said electron beam on said active surface of the IC chip with a loading current between about 0.01 $\mu$A and about 100 $\mu$A.

19. A method for identifying a weak node that has insufficient driving current in an IC chip according to claim 11, wherein said step of scanning said electron beam on an active surface of the IC chip being conducted point-to-point with a scanning time of about 1 msec at each point.

20. A method for locating a weak circuit that has insufficient driving current in an IC chip comprising the steps of:

mounting the IC chip in a cavity of a scanning electron microscope, withdrawing a vacuum in said cavity of the scanning electron microscope, scanning a plurality of circuits by an electron beam on an active surface of said IC chip, said electron beam having a loading current between about 0.01 $\mu$A and about 100 $\mu$A, pulling down a driving current onto a circuit been scanned by said loading current of said electron beam from said scanning electron microscope to cause a functional failure of said circuit, testing said failed circuit with a tester mounted juxtaposed to said electron beam to confirm a reduction of said driving current of said failed circuit by said loading current, highlighting said failed circuit by an imaging means in said microscope, and locating other failed circuits by continuing scanning said active surface of the IC chip with said electron beam carrying said loading current.

* * * * *